(12) United States Patent
Sunohara et al.

(10) Patent No.: US 7,952,191 B2
(45) Date of Patent: May 31, 2011

(54) SEMICONDUCTOR DEVICE

(75) Inventors: Masahiro Sunohara, Nagano (JP);
Mitsutoshi Higashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 176 days.

(21) Appl. No.: 12/187,636

(22) Filed: Aug. 7, 2008

(65) Prior Publication Data

US 2009/0040715 A1    Feb. 12, 2009

(30) Foreign Application Priority Data

Aug. 9, 2007  (JP) ................................ 2007-207962

(51) Int. Cl.
*H01L 23/34* (2006.01)
(52) U.S. Cl. . 257/712; 257/714; 257/717; 257/E33.075; 361/688; 361/689; 361/699
(58) Field of Classification Search .................. 257/276, 257/625, 675, 706, 707, 712–722, 796, E33.075, 257/E31.131, E23.051, E23.08–E23.113, 257/678; 361/688, 689, 699
See application file for complete search history.

(56) References Cited

U.S. PATENT DOCUMENTS

| 4,649,990 A | * | 3/1987 | Kurihara et al. | ............. 165/80.4 |
| 5,349,831 A | * | 9/1994 | Daikoku et al. | ................. 62/376 |
| 6,351,384 B1 | | 2/2002 | Daikoku et al. | ............... 361/704 |
| 6,366,462 B1 | * | 4/2002 | Chu et al. | ....................... 361/699 |
| 6,433,413 B1 | * | 8/2002 | Farrar | ............................ 257/678 |
| 6,822,170 B2 | * | 11/2004 | Takeuchi et al. | .............. 174/258 |
| 7,019,971 B2 | * | 3/2006 | Houle et al. | ................... 361/699 |
| 7,149,084 B2 | * | 12/2006 | Matsushima et al. | ......... 361/699 |
| 7,675,163 B2 | * | 3/2010 | Heydari et al. | ............... 257/704 |

FOREIGN PATENT DOCUMENTS

| JP | 2001-15675 | | 1/2001 |
| JP | 2004-228521 | * | 8/2004 |
| WO | WO 00/40067 | | 7/2000 |

OTHER PUBLICATIONS

European Search Report dated Dec. 29, 2008.

* cited by examiner

*Primary Examiner* — Jasmine J Clark
(74) *Attorney, Agent, or Firm* — Kratz, Quintos & Hanson, LLP

(57) ABSTRACT

A semiconductor device of the present invention includes a wiring substrate, a plurality of semiconductor chips mounted on the wiring substrate, and a radiation plate arranged over a plurality of semiconductor chips, and having a cooling passage to flow water in a horizontal direction to the wiring substrate. A plurality of semiconductor chips are arranged along the cooling passage, and out of the plurality of semiconductor chips, the semiconductor chip arranged on an inflow side of the cooling passage, has a smaller amount of heat generation than the semiconductor chip arranged on an outflow side of the cooling passage. For example, a memory chip is arranged on the inflow side of the cooling passage, and a logic chip is arranged on the outflow side of the cooling passage.

8 Claims, 6 Drawing Sheets

| | heat radiation amount (w) | chip temperature (°C) | | water flowing direction |
| --- | --- | --- | --- | --- |
| | | air-cooling | water-cooling | |
| chip 1 | 0.5 | 76.38 | 45.09 | ↓ |
| chip 2 | 0.5 | 81.51 | 63.12 | |
| chip 3 | 60 | 100.33 | 108.98 | |

○ : water-cooling
× : air-cooling chip position

→ water flowing direction water flowing direction water flowing direction water flowing direction

SEMICONDUCTOR DEVICE

CROSS-REFERENCE TO RELATED APPLICATIONS

This application is based on and claims priority of Japanese Patent Application No. 2007-207962 filed on Aug. 9, 2007, the entire contents of which are incorporated herein by reference.

BACKGROUND OF THE INVENTION

1. Field of the Invention

The present invention relates to a semiconductor device and, more particularly, a semiconductor device in which a plurality of semiconductor chips are mounted and which has a cooling mechanism for suppressing a temperature rise of a semiconductor chip.

2. Description of the Related Art

In the prior art, in order to achieve enhanced performance and downsizing of the electronic equipment, the semiconductor devices such as the multi chip module (MCM), the stacked package, and the like, each of which is constructed by mounting a plurality of semiconductor chips on the wiring substrate, have been developed.

In such semiconductor device, in order to improve the heat radiation characteristic, the semiconductor chips are cooled by fitting the radiation plate typified by the heat sink, or the fan.

As the technology related with such cooling mechanism, in Patent Literature 1 (Patent Application Publication 2001-15675), the multi chip module which is cooled by flowing the cooling water through the passage provided over the semiconductor chips is disclosed. In order to cool uniformly effectively a plurality of semiconductor chips whose heat generation characteristics are different respectively, the cooling mechanism in which a thickness of the radiation plate is changed based on an amount of heat generation of the semiconductor chips is set forth.

In the above semiconductor device, sometimes the semiconductor chips such as logic chip, ASIC, and the like, whose power consumption is large, and the semiconductor chips such as DRAM, and the like, which are weak to heat, are mounted to be mixed. Commonly, a plurality of semiconductor chips are mounted on one radiation plate such that heat can be spread to it. Therefore, the semiconductor chips having a large amount of heat generation are cooled effectively. But such heat is transferred conversely to the semiconductor chips that are weak to heat via the radiation plate, and thus a temperature of such semiconductor chips rises and a malfunction or a thermal breakdown is caused.

SUMMARY OF THE INVENTION

It is an object of the present invention to provide a semiconductor device capable of cooling effectively a plurality of semiconductor chips even when a plurality of semiconductor chips whose heat generation characteristics are different respectively are mounted.

There is provided a semiconductor device, which includes a wiring substrate; a plurality of semiconductor chips mounted on the wiring substrate; and a radiation plate arranged over the plurality of semiconductor chips, and having a cooling passage to flow water in a horizontal direction to the wiring substrate; wherein the plurality of semiconductor chips are arranged along the cooling passage, and out of the plurality of semiconductor chips, the semiconductor chip arranged on an inflow side of the cooling passage, has a smaller amount of heat generation than the semiconductor chip arranged on an outflow side of the cooling passage.

In the semiconductor device of the present invention, the radiation plate is provided over the wiring substrate on which a plurality of semiconductor chips are formed, and the cooling passage to flow the water through the radiation plate in the horizontal direction is provided. Also, a plurality of semiconductor chips are arranged along the cooling passage such that the semiconductor chip, which has a small amount of heat generation and is weak to heat, out of the semiconductor chips is arranged on the inflow port side of the cooling passage and also the semiconductor chip, which has a large amount of heat generation and is resistant to heat, is arranged on the outflow port side of the cooling passage.

In the present invention, the semiconductor device having the cooling passage is devised such that both the semiconductor chip which has a small amount of heat generation and is weak to heat, and the semiconductor chip which has a large amount of heat generation and is resistant to heat are cooled effectively. A temperature of the water flowing through the cooling passage is distributed such that a temperature on the inflow port side of the cooling passage is low and a temperature on the outflow port side is high. By utilizing such phenomenon positively, when the semiconductor chips which are weak to heat are arranged on the inflow port side, a temperature of such semiconductor chips can be lowered intensively. As a result, the semiconductor chips which are weak to heat can be operated stably for a long term to prevent a malfunction caused by heat.

Also, in the semiconductor device of the present invention, the cooling passage is provided in the radiation plate, and then the semiconductor chips are cooled by flowing the cooling water through the cooling passage. Therefore, the heat sink or the fan which is used in the air-cooling system and has a large size is not used. As a result, a thinner type and a miniaturization of the semiconductor device can be attained.

As another mode, there is provided a semiconductor device, which includes a wiring substrate having a cooling passage to flow water in a horizontal direction to the wiring substrate; and a plurality of semiconductor chips mounted on the wiring substrate; wherein the plurality of semiconductor chips are arranged along the cooling passage, and out of the plurality of semiconductor chips, the semiconductor chip arranged on an inflow side of the cooling passage, has a smaller amount of heat generation than the semiconductor chip arranged on an outflow side of the cooling passage.

Also, in the semiconductor device of above mode, the wiring substrate may be constructed by providing the built-up wiring on the substrate in which the through electrodes are provided. Also, a plurality of semiconductor chips may be mounted on at least one of the upper side or the lower side of the wiring substrate.

In the semiconductor device of the present invention, the cooling passage is provided in the interposer which is constructed by providing the built-up wiring on the substrate in which the through electrodes are provided. Then, the semiconductor chip, which has a small amount of heat generation and is weak to heat, out of the semiconductor chips is arranged on the inflow port side of the cooling passage and also the semiconductor chip, which has a large amount of heat generation and is resistant to heat, is arranged on the outflow port side of the cooling passage.

In this case also, a temperature of the water flowing through the cooling passage is distributed such that a temperature on the inflow port side of the cooling passage is low and a temperature on the outflow port side is high. By utilizing such phenomenon positively, when the semiconductor chips which are weak to heat are arranged on the inflow port side, a temperature of such semiconductor chips can be lowered intensively. As a result, the semiconductor chips which are weak to heat can be operated stably for a long term to prevent a malfunction caused by heat.

Also, when the semiconductor chips are mounted not only on the upper side of the interposer but also on the lower side, the semiconductor chips which are mounted on both the upper and lower sides of the interposer can be cooled simultaneously.

As described above, according to the semiconductor device of the present invention, in the semiconductor device constructed by mounting a plurality of semiconductor chips whose heat generation characteristics are different respectively, the semiconductor chips which are weak to heat can be cooled intensively.

DETAILED DESCRIPTION OF THE PREFERRED EMBODIMENTS

Embodiments of the present invention will be explained with reference to the drawings hereinafter.

(1) First Embodiment

Prior to explanation of a semiconductor device of a first embodiment, problems of the semiconductor device having the MCM (Multi Chip Module) structure in the related art will be explained hereunder.

Figure 1:
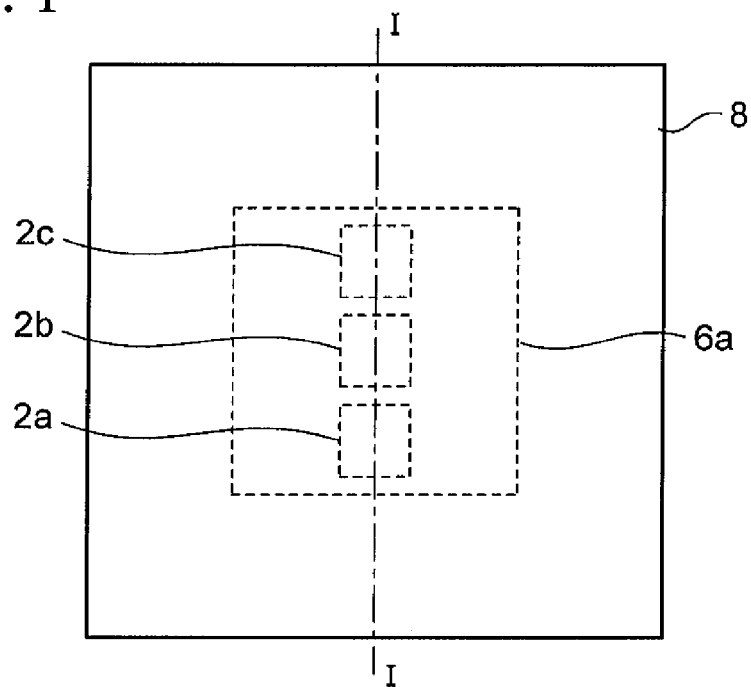
FIG. 1 and FIG. 2 are configurative views showing a semiconductor device having an MCM structure in the related art.
Figure 2:
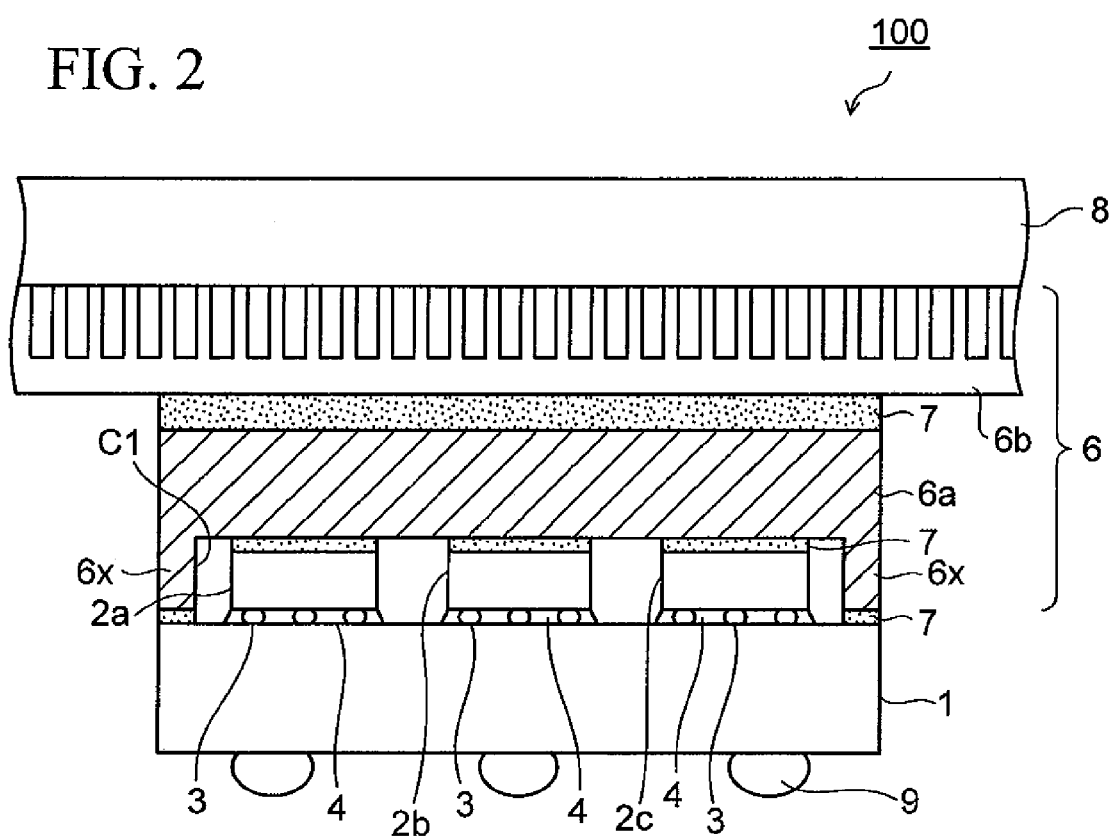

FIG. 1 and FIG. 2 are views showing an example of a structure of the semiconductor device in the related art. A top view of the semiconductor device is shown in FIG. 1, and a sectional view taken along an I-I line in FIG. 1 is shown in FIG. 2.

As shown in FIG. 1 and FIG. 2, a semiconductor device 100 is constructed basically such that a plurality of semiconductor chips 2a, 2b, 2c are mounted on a multilayer wiring substrate 1 in which predetermined built-up wirings (not shown) are provided and a radiation plate 6 is arranged thereon.

Respective bumps 3 of the semiconductor chips 2a, 2b, 2c are flip-chip connected to a connection portion of the multilayer wiring substrate 1. For example, the semiconductor chips 2a and 2c are a memory device such as DRAM, or the like, and the semiconductor chip 2b is the logic device such as CPU, or the like.

Also, an underfill resin 4 is filled between the semiconductor chips 2a, 2b, 2c and the multilayer wiring substrate 1. Also, external connection terminals 9 formed of a solder ball, or the like are provided on a lower surface of the multilayer wiring substrate 1.

The radiation plate 6 is arranged over the semiconductor chips 2a, 2b, 2c and the multilayer wiring substrate 1. The radiation plate 6 is constructed by a heat spreader 6a and a heat sink 6b. A cavity C1 is provided in the center portion of the heat spreader 6a, and a projected joint portion 6x on the periphery is joined to a peripheral portion of the multilayer wiring substrate 1 by a conductive adhesive 7.

The semiconductor chips 2a, 2b, 2c are housed in the cavity C1 of the heat spreader 6a, and their upper surfaces are joined to an inner surface of the cavity C1 of the heat spreader 6a by the conductive adhesive 7. Also, a lower surface of the heat sink 6b is joined to an upper portion of the heat spreader 6a by the conductive adhesive 7.

An area of a bottom surface of the heat sink 6b is wider than an area of an upper surface of the heat spreader 6a. And an overall surface area of the heat sink 6b is widened by forming groove portions on the upper surface side of the heat sink 6b. Thereby, a heat radiation amount of the heat sink 6b can be increased. Also, air-cooling is applied by providing a fan 8 to an upper portion of the heat sink 6b such that the overall semiconductor device 100 is cooled.

As described above, the radiation plate and the fan are used as a cooling means for the semiconductor chips. Commonly different type of chips are used as a plurality of semiconductor chips mounted in the semiconductor device 100, and an amount of heat generation from each semiconductor chip is different depending upon the type of semiconductor chip. For example, the function chip such as CPU, or the like for performing computation or deciding process has a large amount of heat generation in operation, while an amount of heat generation of the memory chip is considerably small in contrast to an amount of heat generation of CPU.

The heat generated from the semiconductor chip 2b (CPU) is radiated to the outside via the radiation plate 6 (the heat spreader 6a and the heat sink 6b), and also this heat is diffused into an inside of the heat spreader 6a. Thus, this heat is transferred to the upper portions of the adjacent semiconductor chips 2a, 2c (DRAM). This heat is at a higher temperature than that generated from the memory chip. Consequently, a temperature of the semiconductor chips 2a, 2c (DRAM) rises, and sometimes a malfunction or a thermal breakdown is caused. A withstand temperature of the CPU is relatively high, but a withstand temperature of the memory chip is low. Therefore, it is required that a temperature rise of the memory chip must be avoided to the utmost.

The inventors of this application focused on the fact that withstand temperatures of the semiconductor chips mounted on the semiconductor device are different respectively, and then studied earnestly such a subject that a cooling effect in the semiconductor chips which are weak to heat should be enhanced rather than that on the semiconductor chips which are resistant to heat. As a result, the inventors of this application could find such an approach that the above problem can be solved by employing a water-cooling system while taking account of alignment order of the semiconductor chips.

Figure 3:
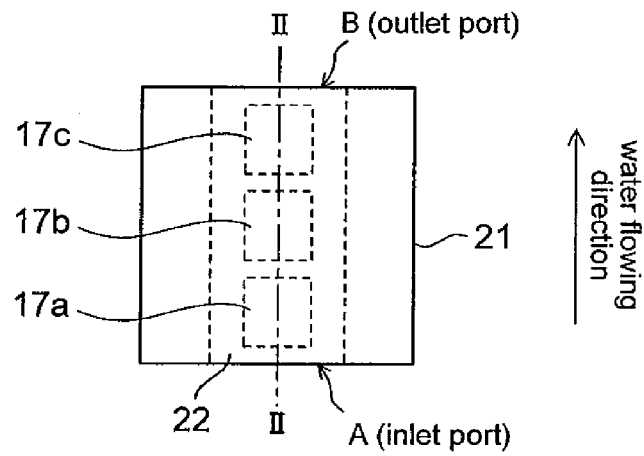
FIG. 3 and FIG. 4 are configurative views showing a semiconductor device of a first embodiment of the present invention.
Figure 4:
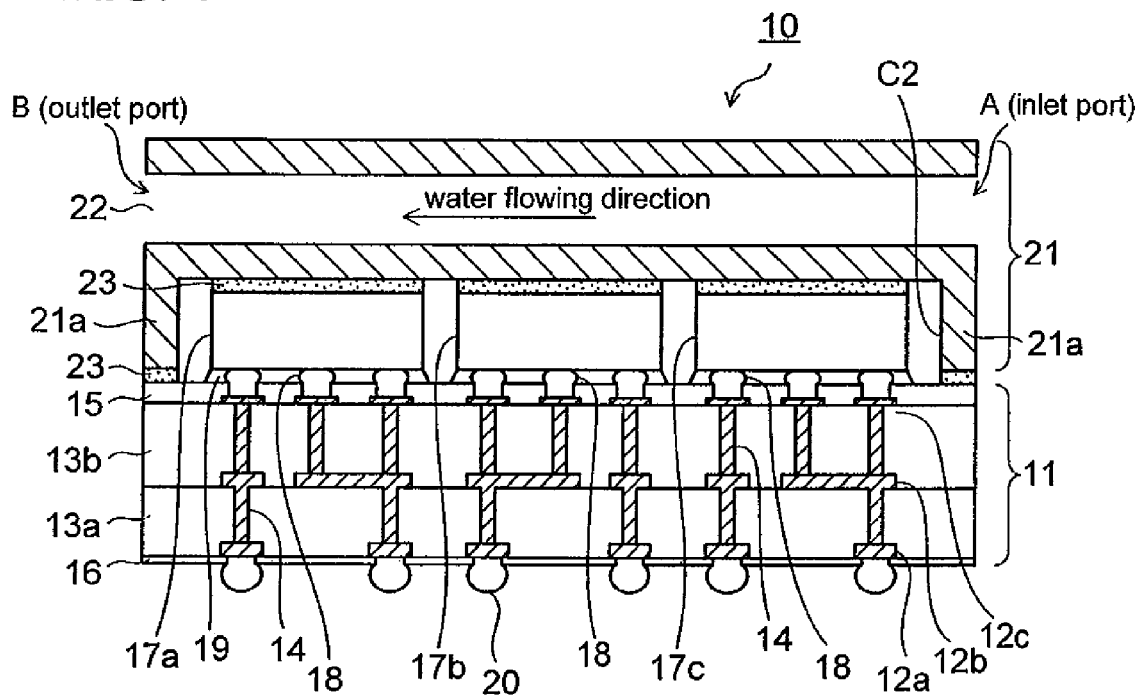

Next, a semiconductor device of a first embodiment of the present invention will be explained hereunder. FIG. 3 and FIG. 4 are views showing an example of a structure of a semiconductor device 10 of the first embodiment. FIG. 3 shows a top view of the semiconductor device 10, and FIG. 4 shows a sectional view taken along an II-II line in FIG. 3.

As shown in FIG. 3 and FIG. 4, the semiconductor device 10 of the first embodiment is constructed basically such that three semiconductor chips 17a, 17b, 17c are mounted on a multilayer wiring substrate 11 in which a three-layered built-up wiring layers are formed and a radiation plate 21 (heat sink) is arranged thereon.

Wiring layers 12a, 12b, 12c of the multilayer wiring substrate 11 and interlayer insulating films 13a, 13b are formed such that they are stacked mutually. Respective wiring layers 12a, 12b, 12c are connected mutually via via holes 14 provided in the interlayer insulating films 13a, 13b. A solder resist 15 in which openings are provided on connection portions of the wiring layers 12c is formed on an upper surface of the multilayer wiring substrate 11. Also, bumps 18 of the semiconductor chips 17a, 17b, 17c are flip-chip connected to the connection portions of the wiring layers 12c. An underfill resin 19 is filled between the semiconductor chips 17a, 17b, 17c and the multilayer wiring substrate 11.

Also, a solder resist 16 in which openings are provided on connection portions of the wiring layers 12a is formed on a lower surface of the multilayer wiring substrate 11. Also, external connection terminals 20 formed by mounting a solder ball, or the like respectively are provided on connection portions of the wiring layers 12a.

Also, the radiation plate 21 is arranged over the semiconductor chips 17a, 17b, 17c and the multilayer wiring substrate 11. The radiation plate 21 is constructed by coating a nickel (Ni) layer on a surface of a copper (Cu) member, for example. A projected joint portion 21a is formed on a peripheral portion of the radiation plate 21 by providing a cavity C2 in the center portion. The projected joint portion 21a is jointed to a peripheral portion of the multilayer wiring substrate 11 by a conductive adhesive 23. As the conductive adhesive 23, for example, a silver paste is used. Also, the upper surfaces of the semiconductor chips 17a, 17b, 17c are joined to an inner surface of the cavity C2 of the radiation plate 21 by the conductive adhesive 23. By using the conductive adhesive 23, not only the radiation plate 21 can be fixed to the semiconductor chips 17a, 17b, 17c, but also the heat generated from the semiconductor chips 17a, 17b, 17c can be escaped.

In this manner, the semiconductor chips 17a, 17b, 17c are mounted to be housed in an inside of the cavity C2 of the radiation plate 21.

A plurality of semiconductor chips (in the example in FIG. 4, three) are mounted by one row on the upper portion of the multilayer wiring substrate 11. Out of these chips, the semiconductor chip 17a is the logic device such as CPU, or the like, and is resistant to heat and has a large amount of heat generation. As the semiconductor chip 17a having a large amount of heat generation, there is the logic chip such as ASIC (low power CPU), or the like in addition to CPU.

Also, the semiconductor chip 17b is a flash memory, and has an amount of heat generation smaller than the logic chip of the semiconductor chip 17a. Also, the semiconductor chip 17c is DRAM, and is the weakest to heat among three semiconductor chips 17a, 17b, 17c and has a smallest amount of heat generation. As the semiconductor chips 17b, 17c having a small amount of heat generation, various memory chips such as SRAM, FeRAM, and the like are contained in addition to the flash memory and DRAM.

Three semiconductor chips 17a, 17b, 17c are arranged on the upper portion of the multilayer wiring substrate 11 at a predetermined interval.

Also, in the radiation plate 21, a cooling passage 22 formed to pass through in the horizontal direction along the row of chips is provided over the semiconductor chips 17a, 17b, 17c which are mounted by one row. The semiconductor chips 17a, 17b, 17c can be cooled by flowing cooling water through the cooling passage 22. The cooling passage 22 shown in FIG. 4 has an inlet port A on its right side and an outlet port B on its left side. That is, the semiconductor chip 17c which has a small amount of heat generation and is weak to heat is arranged on the inlet port A side of the cooling passage 22, and the semiconductor chip 17a which has a large amount of heat generation and is resistant to heat is arranged on the outlet port B side of the cooling passage 22. In this manner, a plurality of semiconductor chips 17a, 17b, 17c are aligned along the cooling passage 22.

Next, such a mechanism will be explained hereunder, when the semiconductor chips 17a, 17b, 17c are aligned as shown in FIG. 3 and FIG. 4 and cooling water is passed through the cooling passage 22, these semiconductor chips can be cooled effectively.

Figure 5:
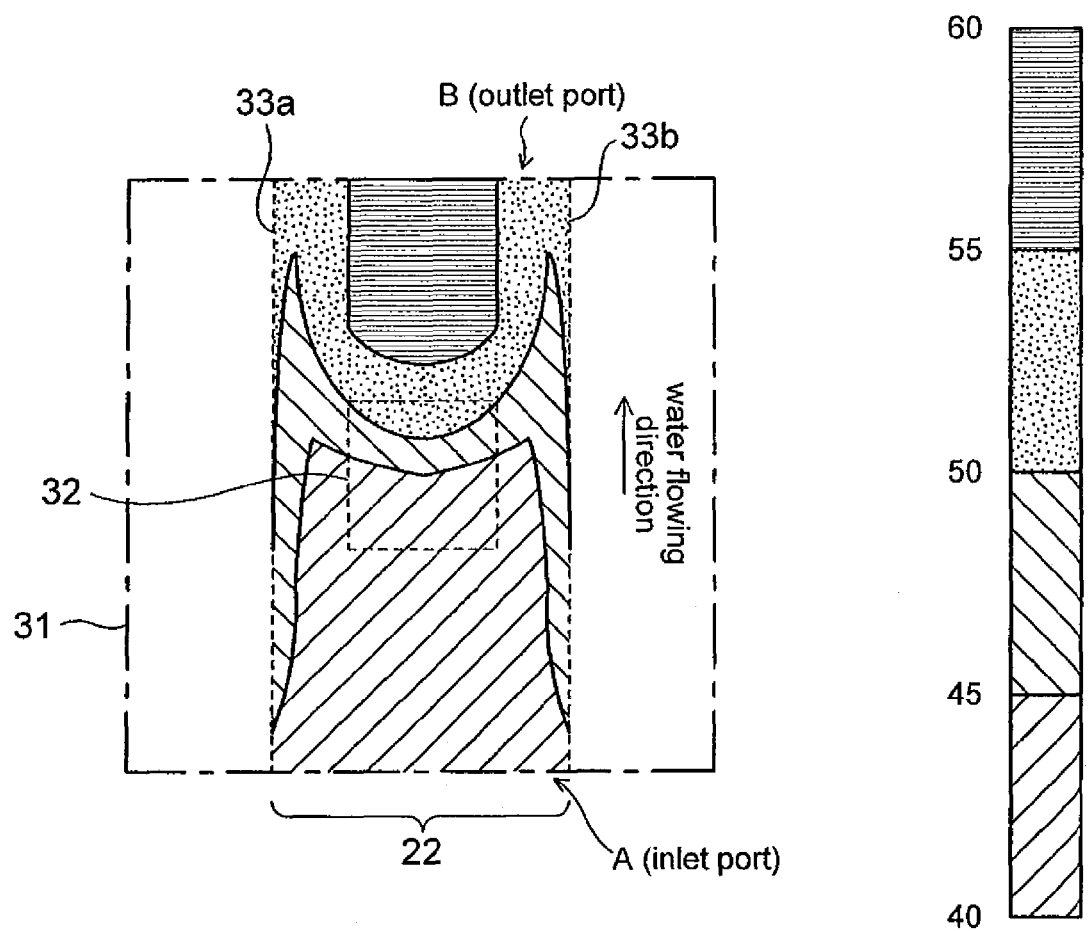
FIG. 5 is a view showing the simulation result of a temperature distribution caused by a heat generation of a semiconductor chip.

First, a temperature distribution of the water obtained when the semiconductor chips are cooled by passing the cooling water through the cooling passage 22 in a situation that one semiconductor chip (also referred to as the "chip" hereinafter) having a large amount of heat generation is mounted in the center of the package was studied. FIG. 5 shows the simulation result of a temperature distribution. In this simulation, an amount of heat generation of the chip was set to 60 W, and the temperature of the water flowing into the cooling passage 22 was set to 40° C.

An area enclosed by a dot-dash line in FIG. 5 denotes a package 31, and an area enclosed by a broken line denotes a chip 32 mounted in the center portion of the package. A size of the package 31 is 40 mm□, and a size of the chip 32 is 10 mm□. Also, an area put between broken lines 33a, 33b denotes a position in which the cooling passage 22 is arranged. In the cooling passage 22, the lower side in FIG. 5 becomes the inlet port A on and the upper side in FIG. 5 becomes the outlet port B.

As shown in FIG. 5, a temperature of the water was 40 to 45° C. (right-upward slash portion) in the area extending from the inlet port A of the cooling passage 22 to the almost center portion of the chip 32. Also, a temperature of the water rose from 45 to 50° C. (right-downward slash portion) to 50 to 55° C. (dot-hatched portion) in the area from the center portion of the chip 32 to the neighboring outlet port B side. Also, a temperature of the water was 55 to 60° C. (horizontally slash portion) in the center portion of the area from there to the outlet port B and 50 to 55° C. (dot-hatched portion) in both end sides. In this manner, it was confirmed that a temperature of the water rises as the position comes closer to the outlet port B side from the inlet port A.

As apparent from the result in FIG. 5, a temperature of the water rises higher as the position comes closer to the outlet port B side of the cooling passage 22 in the chip 32 which generates the high heat. For this reason, there is a such risk that, when the chip which is weak to heat is arranged on the outlet port B side of the cooling passage 22, a malfunction or a thermal breakdown of the chip is caused by the high heat. Next, the simulation result of temperature when a plurality of chips whose amount of heat generation is different respectively are mounted in the package will be explained hereunder.

Figures 6, 7:
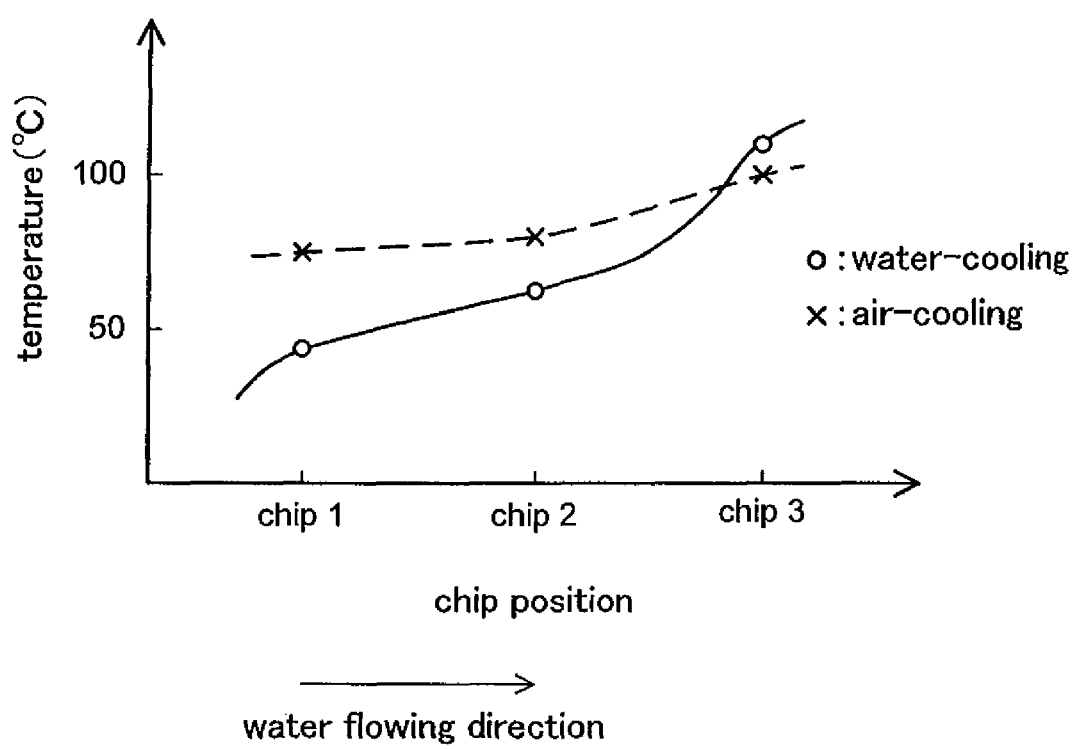
FIG. 6 and FIG. 7 are views explaining the simulation result of a temperature distribution caused by a heat generation of a plurality of semiconductor chips.

FIG. 6 shows the result of a temperature of the chip calculated by the simulation when the air-cooling or the water-cooling is applied, in the semiconductor device on which one chip whose amount of heat generation is large and two chips whose amount of heat generation are small are mounted.

Out of three used chips, an amount of heat generation of the chip 1 and the chip 2 was set to 0.5 W, and an amount of heat generation of the chip 3 was set to 60 W. These chips are arranged by one row toward the water flowing direction in order of the chip 1, the chip 2, and the chip 3.

The air-cooling in FIG. 6 corresponds to the case where the semiconductor device 100 in the related art shown in FIG. 1 and FIG. 2 is used, as described above. The top portions of the chip 1 to the chip 3 are cooled totally by the radiation plate and the fan. Also, the water-cooling corresponds to the case where the semiconductor device 10 according to the first embodiment is used. The chips are aligned in order of the chip 1, the chip 2, and the chip 3 from the inlet port A side to the outlet port B side. In other words, the chip which has a small amount of heat generation and is weak to heat (the chip 1) is arranged on the inlet port A side of the cooling passage 22, and the chip which has a large amount of heat generation and is resistant to heat (the chip 3) is arranged on the outlet port B side of the cooling passage 22.

FIG. 7 is a view in which the temperatures (data in FIG. 6) of the chips when the chips are arranged as described above are graphed. For the sake of comparison, a broken line indicates a temperature of the chips when the air-cooling in FIG. 1 and FIG. 2 is applied to the chips which are arranged similarly.

As shown in FIG. 6 and FIG. 7, a temperature of the chip 1 was 76.38° C. when the air-cooling was applied, and was 45.09° C. when the water-cooling was applied. Also, a temperature of the chip 2 was 81.51° C. when the air-cooling was applied, and was 63.12° C. when the water-cooling was applied. Also, a temperature of the chip 3 was 100.33° C. when the air-cooling was applied, and was 108.98° C. when the water-cooling was applied. In this manner, temperatures of the chip 1 and the chip 2 when the water-cooling was applied were considerably lower than those when the air-cooling was applied, but a temperature of the chip 3 when the water-cooling was applied was slightly higher than that when the air-cooling was applied.

With regard to the chip 1 and the chip 2 which are weak to heat, when not the air-cooling but the water-cooling in the first embodiment is applied, an increase of temperature can be suppressed. Therefore, the chip which is weak to heat can be operated stably without malfunction for a longer term than the case where the air-cooling is applied.

In contrast, with regard to the chip 3 which is resistant to heat, when the water-cooling in the first embodiment is applied, a temperature of the chip is increased slightly higher than the case where the air-cooling is applied. However, the chip 3 which is resistant to heat is designed to withstand the high heat to some extent, and thus there is no problem with its operation in practical use if the temperature is within a tolerance range.

Figure 8:
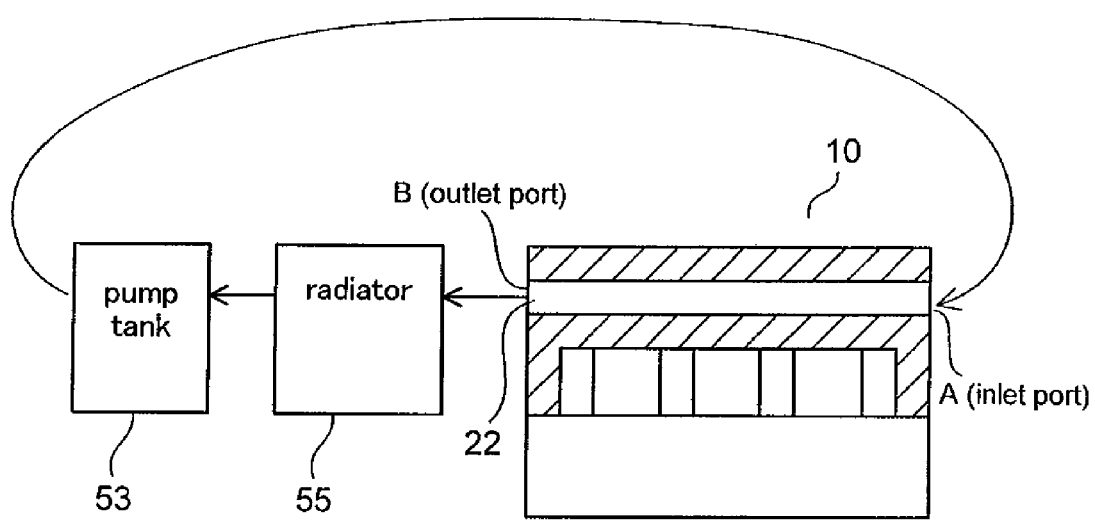
FIG. 8 is a schematic view showing a cooling water circulating mechanism of the semiconductor device of the first embodiment of the present invention.

FIG. 8 is a schematic view showing an example of the overall configuration containing the semiconductor device 10 equipped with the above water-cooled cooling mechanism.

The cooling water flowing through the cooling passage 22 of the semiconductor device 10 in FIG. 8 is used to circulate in the direction indicated with an arrow in FIG. 8. A temperature of the cooling water flowing in from the inlet port A on the right side of the semiconductor device 10, is increased by the heat generated from the semiconductor chips as the cooling water moves through the cooling passage 22 to the left side. This cooling water flows out from the outlet port B on the left side of the cooling passage 22, then a temperature of this water is decreased to a predetermined temperature (e.g., 40° C.) or less by a radiator (heat exchanger) 55, and then the cooled water is accumulated in a pump tank 53. The cooled water in the pump tank 53 is fed to the semiconductor device 10 again by a pump, and the water passes through the cooling passage 22 in the semiconductor device 10 to cool the semiconductor chips. When the cooling water is circulated in this manner, a temperature rise of the cooling water can be suppressed and the semiconductor chips can be cooled stably.

As described above, in the semiconductor device 10 in the first embodiment, for the purpose of utilizing positively a difference in a temperature of the water flowing through the cooling passage 22, the semiconductor chip which is weak to heat is arranged on the inlet port A side of the cooling passage 22 in which a temperature of the water is low, and thus a temperature of the semiconductor chip is decreased intensively. As a result, a temperature of the semiconductor chip which is weak to heat can lowered intensively, and thus the semiconductor chip which is weak to heat can be operated stably for a long term without malfunction. In contrast, the semiconductor chip whose amount of heat generation is large has a heat-resisting property. Therefore, even when such semiconductor chip is arranged on the outlet port B side of the cooling passage 22 in which a temperature becomes relatively high, such semiconductor chip can be cooled to such an extent that sufficient performance can be obtained.

Also, in the semiconductor device 10 of the first embodiment, the cooling passage 22 is provided to the radiation plate 21, and the semiconductor chips are cooled by flowing the cooling water through it. The heat sink and the fan which are used in the air-cooling system and have a large size are not used. Therefore, a thinner type and a size reduction of the semiconductor device 10 can be achieved.

In the above explanation, three chips composed of two chips having a small amount of heat generation and one chip having a large amount of heat generation were studied. On the basis of this study, in the case where three chips have a different amount of heat generation respectively, it can be appreciate that when the semiconductor chips are arranged from the inlet port A side to the outlet port B side of the cooling passage 22 in order with small amount of heat generation, a temperature of the water flowing through the cooling passage 22 is lowered as the water comes closer to the inlet port A side, and the weaker chip to heat can be cooled intensively.

Also, in the case where the number of the semiconductor chips is four, or more, when the semiconductor chips are arranged from the inlet port A side to the outlet port B side of the cooling passage 22 such that their amounts of heat generation are aligned from a small value to a large value, the weaker semiconductor chips to heat can be cooled more intensively.

Also, the case where one cooling passage 22 is provided is explained as above. But the present embodiment is not limited to this mode. A plurality of cooling passages 22 may be formed in the radiation plate 21. For example, the cooling passage 22 may be formed in plural in parallel in the horizontal direction or the vertical direction.

The radiation plate 21 having the cooling passage 22 in the first embodiment is formed as follows.

First, a first metal plate constituting the radiation plate 21 is prepared, and a cavity of a predetermined size is provided to the first metal plate. This cavity may be formed by the press working using the die or may be formed by the drilling or the laser beam processing. Then, a groove of a predetermined size is formed on a surface of the first metal plate on the opposite side to the surface on which the cavity is formed. Then, the radiation plate 21 having the cooling passage 22 is formed by joining a second metal plate to the first metal plate in which the groove is formed.

The semiconductor device of the present embodiment is manufactured by joining the radiation plate formed in this manner and the multilayer wiring substrate on which the semiconductor chips together.

(2) Second Embodiment

In the second embodiment, a semiconductor device in which a cooling passage through which the cooling water for cooling the semiconductor chip flows is formed in an interposer will be explained hereunder.

Figure 9:
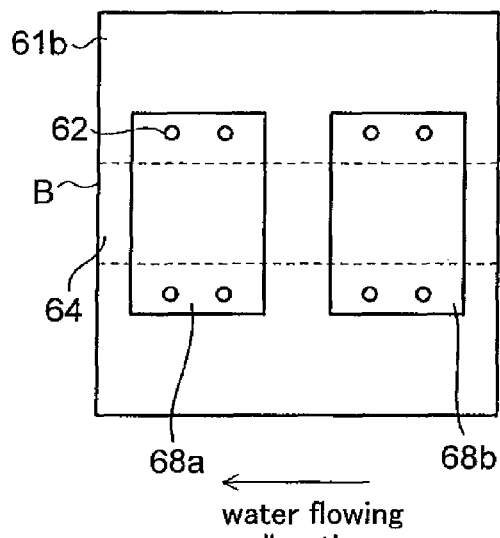
FIG. 9, FIG. 10, and FIG. 11 are configurative views showing a semiconductor device of a second embodiment of the present invention.
Figure 10:
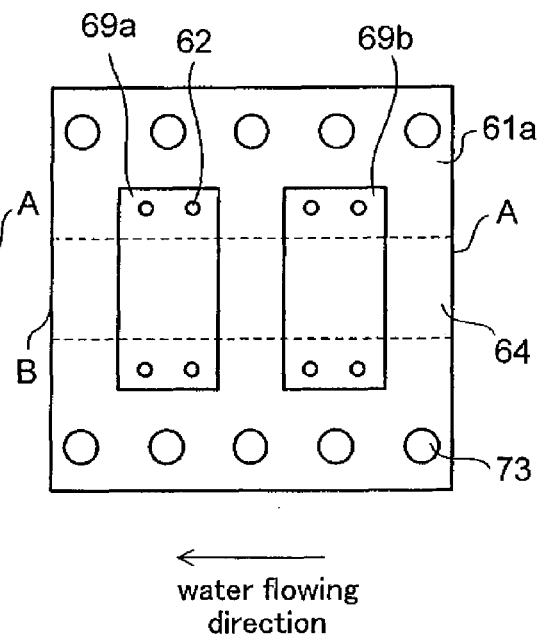
Figure 11:
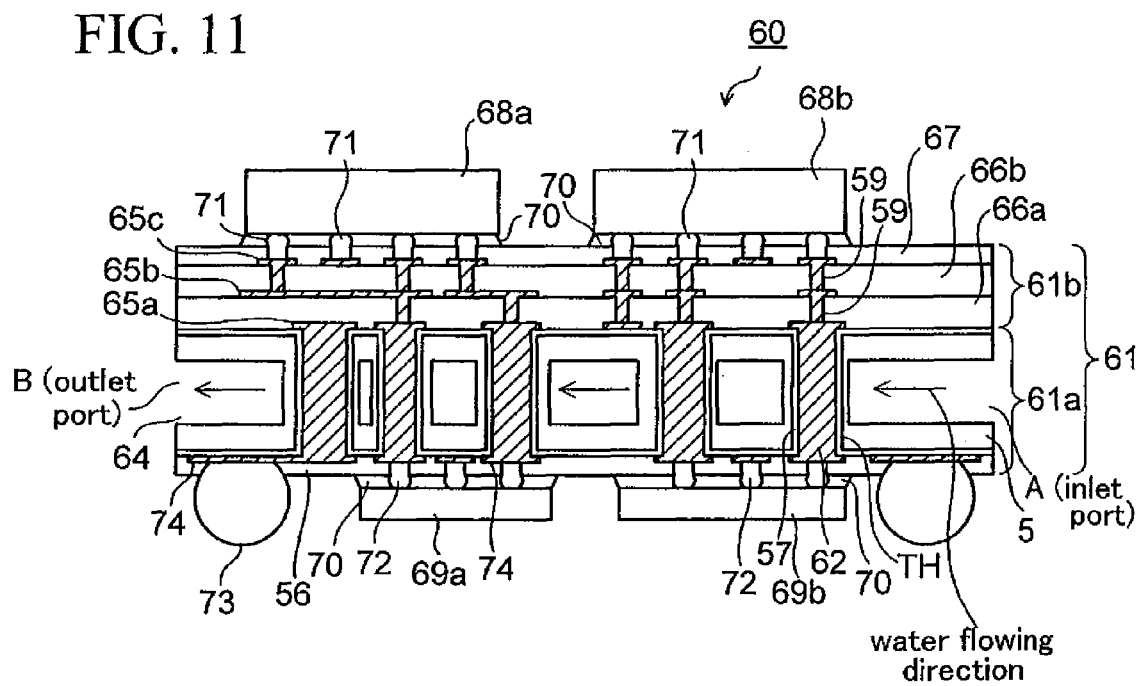

An example of a semiconductor device 60 in which a cooling passage is formed in an interposer is shown in FIG. 9, FIG. 10, and FIG. 11. FIG. 9 is a top view of the semiconductor device, and FIG. 10 is a bottom view of the same. Also, FIG. 11 is a sectional view of the semiconductor device viewed from the front side of the through electrode 62 along a centerline of the cooling passage 64 in FIG. 9.

As shown in FIG. 11, a semiconductor device 60 of the second embodiment is constructed basically by an interposer 61 composed of a wiring substrate 61a with a flow path, to which cooling passages 64 are provided and a multilayer wiring portion 61b formed thereon, and semiconductor chips 68a, 68b, 69a, 69b mounted on both the upper and lower side of the interposer 61.

Through holes TH passing through a substrate 5 in the vertical direction are provided in the wiring substrate 61a with the flow path of the interposer 61, and an insulating layer 57 formed of a silicon oxide film is formed in its inner surfaces respectively. Also, through electrodes 62 are provided by filling a copper in the through holes TH respectively. The through electrodes 62 are insulated electrically from other through electrodes 62 by the insulating layer 57.

By reference to FIG. 9 and FIG. 10, the through electrodes 62 are provided in the neighboring areas of the cooling passages 64 on both end sides of the substrate 5 to avoid the cooling passages 64. Details of the cooling passages 64 will be described later.

Also, a wiring layer 74 is provided on the lower surface side of the interposer 61, and also a solder resist 56 in which opening portions are provided in connection portions of the wiring layer 74 is formed. Respective bumps 72 of the semiconductor chips 69a, 69b are flip-chip connected to the wiring layer 74. External connection terminals 73 are provided to the wiring layer 74 of outside of the semiconductor chips 69a, 69b on the lower surface side of the interposer 61 by mounting a solder ball respectively.

In this case, preferably a silicon substrate (thickness of 200 to 300 μm) is used as the substrate 5 of the interposer 61. Since the fine patterning can be applied by using the silicon substrate, the high-density packaging for actualizing miniaturization, thinner type, enhanced performance, etc. of the semiconductor device can be attained.

The multilayer wiring portion 61b is formed of a built-up wiring, and the semiconductor chips 68a, 68b are connected to the upper surface of the multilayer wiring portion 61b. In the example in FIG. 11, a three-layered built-up wiring is formed on the substrate 5. Wiring layers 65a, 65b, 65c and interlayer insulating films 66a, 66b in the multilayer wiring portion 61b are formed such that they are stacked mutually. Respective wiring layers 65a, 65b, 65c are connected mutually via via holes 59 provided in the interlayer insulating films 66a, 66b. A solder resist 67 in which openings are provided in connections portions of the wiring layer 65c is formed on the multilayer wiring portion 61b. Also, bumps 71 of the semiconductor chips 68a, 68b are flip-chip connected to the wiring layer 65c. Also, an underfill resin 70 is filled between the semiconductor chips 68a, 68b and the multilayer wiring portion 61b.

The wiring layer 65a of the multilayer wiring portion 61b is connected to the upper portions of the through electrodes 62, and the lower portions of the through electrodes 62 are connected to the wiring layer 74 on the lower surface side of the interposer 61. In this manner, the wiring layers 65a, 65b, 65c on the upper surface side and the wiring layer 74 on the lower surface side are connected mutually via the through electrodes 62.

Next, the cooling passage 64 formed in the wiring substrate 61a with the flow path of the interposer 61 will be explained hereunder.

The through holes are formed in the wiring substrate 61a with the flow path of the interposer 61 in the direction where a plurality of semiconductor chips 68a, 68b formed on the upper portion of the interposer 61 or a plurality of semiconductor chips 69a, 69b formed on the lower portion of the interposer 61 are arranged by one row, and serves as the cooling passage 64 of the water used to cool these semiconductor chips 68a, 68b, 69a, 69b. As shown in FIGS. 9 to 11, the cooling passage 64 is provided in the horizontal direction to pass through the interposer 61 from a side surface on one end side to a side surface on the other end side.

In the cooling passage 64 shown in FIGS. 9 to 11, its right side becomes the inlet port A, and its left side becomes the outlet port B. Out of the semiconductor chips. 68a, 68b connected to the upper portion of such interposer 61, the semiconductor chip 68b (DRAM, or the like) which is weak to heat is arranged on the right side in FIGS. 9 to 11. Also, on the lower portion of such interposer 61, the semiconductor chip 69b which is weak to heat, out of the semiconductor chips 69a, 69b is arranged on the right side in FIGS. 9 to 11. In other words, the semiconductor chips 68b, 69b which are weak to heat are arranged on the inlet port A side of the cooling passage 64, and the semiconductor chips 68a, 69a which are resistant to heat are arranged on the outlet port B side of the cooling passage 64.

Here, like the foregoing explanation in FIG. 8, the cooling water passed through the cooling passage 64 is used to circulate after a temperature of the cooling water flown out from the outlet port B is decreased to a predetermined temperature.

As described above, in the semiconductor device 60 of the second embodiment, like the case of the semiconductor device 10 explained in the first embodiment, a cooling effect to the semiconductor chips which are weak to heat can be enhanced by arranging the semiconductor chips 68b, 69b which are weak to heat to the inlet port A side of the cooling passage 64. By lowering the temperature of the semiconductor chips which are weak to heat intensively, such semiconductor chips which are weak to heat can be operated stably for a long term not to cause a malfunction.

Also, in the case where the semiconductor chips are mounted on both upper and lower surfaces of the interposer 61, the cooling effect for not only the semiconductor chips which are connected to the upper surface side of the interposer 61 and are weak to heat, for but also the semiconductor chips which are connected to the lower surface side of the interposer 61 and are weak to heat, can be enhanced by employing the above arrangement.

Here, in the second embodiment, the case where the silicon is used as the substrate 5 of the interposer 61 is explained. But the substrate 5 is not limited to the silicon. For example, the interposer 61 may be formed by using a glass.

Also, in the semiconductor device in FIG. 11, the case where the semiconductor chips are mounted on both upper and lower surfaces of the interposer 61 is illustrated. But it is of course that the semiconductor chips may be mounted only on one surface side of the interposer 61.

Also, in FIGS. 9 to 11, the case where one cooling passage 64 is formed in the interposer 61 is illustrated. But the number of cooling passages is not limited to this mode. The cooling passage 64 may be formed in plural in parallel with the horizontal direction or the vertical direction. When a plurality of cooling passages 64 are formed in the horizontal direction, also the through electrode 62 can be arranged between the cooling passages 64.

Also, in the second embodiment, the cooling passage 64 is formed in the substrate 5 of the interposer 61, and then the semiconductor chips are cooled by flowing the cooling water through the cooling passage 64. But radiation plate may be added to the configuration in FIG. 11 to enhance further a cooling effect of the semiconductor chips. When the radiation plate is arranged over the semiconductor chips being arranged on the upper surface side of the interposer 61, a cooling effect of the semiconductor chips which are provided under the radiation plate and are weak to heat can be enhanced much more.

Also, like the first embodiment, the cooling passage can be provided to the radiation plate arranged over the semiconductor chips.

In this case, the cooling passage 64 in the substrate 5 of the interposer 61 is formed as follows.

First, a first silicon wafer is prepared, and a groove of a predetermined size is formed in the first silicon wafer by the photolithography and the dry etching. Then, a second silicon wafer and the first silicon wafer in which the groove is formed are adhered together. This adhesion is carried out by irradiating the Ar plasma and then applying the annealing at 1000° C.

Also, the substrate 5 of the interposer 61 is not limited to silicon, and a glass may be employed. When a glass is employed, first, a first glass is prepared, then a mask having a predetermined opening portion is formed on the first glass, and then a portion of the glass exposed from the opening portion is processed by the sand blast method, or the like to form a predetermined groove. In this case, the similar structure may be formed by pouring the melted glass into a predetermined die. Then, a second glass and the first glass on which the groove is formed are adhered together.

Also, the interposer 61 may be formed of the silicon and the glass. The silicon on which a predetermined groove is formed by the above method and the glass are adhered together. The silicon and the glass are joined by the anode joining. For example, the silicon and the glass are anode-joined by applying a voltage of 500 V to 1 kV between both members in a state that the silicon and the glass are heated at 300 to 400° C.

The wiring substrate 61a with a flow path, having the through hole which passes through in the horizontal direction and acts as the cooling passage is formed as described above, and then the through electrodes, the multilayer built-up wiring, and the like are formed.

What is claimed is:

1. A semiconductor device, comprising:
a wiring substrate having a cooling passage to flow water in a substantially single direction substantially parallel to at least one side of the wiring substrate, the cooling passage passing through from a side surface on one end side of the wiring substrate to a side surface on the other end side thereof; and
a plurality of semiconductor chips mounted on at least one side of the wiring substrate;
wherein the plurality of semiconductor chips are arranged along the cooling passage, and out of the plurality of semiconductor chips, an amount of heat generated by a semiconductor chip arranged on an inflow side of the cooling passage is smaller than an amount of heat generated by a semiconductor chip arranged on an outflow side of the cooling passage, the water cooling the semiconductor chips in order as arranged along the cooling passage.

2. A semiconductor device according to claim 1, wherein the wiring substrate is constructed by providing a built-up wiring on a substrate in which through electrodes are provided.

3. A semiconductor device according to claim 2, wherein the substrate in which through electrodes are provided is a silicon substrate, a glass substrate, or a substrate in which the silicon substrate and the glass substrate are joined together.

4. A semiconductor device according to claim 1, wherein the plurality of semiconductor chips are mounted on at least one of an upper side or a lower side of the wiring substrate.

5. A semiconductor device according to claim 1, wherein the semiconductor chip arranged on the inflow side of the cooling passage is a memory chip, and the semiconductor chip arranged on the outflow side of the cooling passage is a logic chip.

6. A semiconductor device according to claim 1, wherein the plurality of semiconductor chips are mounted in three or more, and arranged from the inflow side to the outflow side of the cooling passage in order with small amount of heat generation.

7. A semiconductor device according to claim 6, wherein a DRAM chip, a flash memory chip, and a CPU chip are arranged in sequence from the inflow side to the outflow side of the cooling passage.

8. A semiconductor device according to claim 1, wherein cooling water passing through the cooling passage is cooled by a radiator and is circulated.

* * * * *